(12) United States Patent
Cuoco et al.

(10) Patent No.: US 10,553,543 B2
(45) Date of Patent: Feb. 4, 2020

(54) GUARD BOND WIRES IN AN INTEGRATED CIRCUIT PACKAGE

(71) Applicant: Ampleon Netherlands B.V., AV Nijmegen (NL)

(72) Inventors: Vittorio Cuoco, AV Nijmegen (NL); Youri Volkhine, AV Nijmegen (NL); Yi Zhu, AV Nijmegen (NL); Josephus Van Der Zanden, AV Nijmegen (NL); Anna Walesieniuk, AV Nijmegen (NL)

(73) Assignee: Ampleon Netherlands B.V. (NL)

( * ) Notice: Subject to any disclaimer, the term of this patent is extended or adjusted under 35 U.S.C. 154(b) by 8 days.

(21) Appl. No.: 15/573,584

(22) PCT Filed: May 12, 2016

(86) PCT No.: PCT/EP2016/060667
§ 371 (c)(1),
(2) Date: Nov. 13, 2017

(87) PCT Pub. No.: WO2016/180920
PCT Pub. Date: Nov. 17, 2016

(65) Prior Publication Data
US 2019/0006286 A1    Jan. 3, 2019

(30) Foreign Application Priority Data

May 13, 2015    (EP) .................................... 15167488

(51) Int. Cl.
*H01L 23/552*    (2006.01)
*H01L 23/66*    (2006.01)
(Continued)

(52) U.S. Cl.
CPC ............ *H01L 23/552* (2013.01); *H01L 23/66* (2013.01); *H01L 24/48* (2013.01); *H01L 24/49* (2013.01);
(Continued)

(58) Field of Classification Search
None
See application file for complete search history.

(56) References Cited

U.S. PATENT DOCUMENTS

2006/0138650 A1 *    6/2006    Hidalgo .................. H01L 23/66
                                                                    257/728
2006/0197630 A1    9/2006    Fuse
(Continued)

OTHER PUBLICATIONS

The International Search Report (ISR) for PCT/EP2016/060667 dated Jul. 22, 2016, pp. 1-4.
(Continued)

*Primary Examiner* — Anthony Ho
*Assistant Examiner* — Kevin Quinto
(74) *Attorney, Agent, or Firm* — McDonnell Boehnen Hulbert & Berghoff LLP

(57) ABSTRACT

An integrated circuit package is provided. The integrated circuit package comprises a first and second guard bond wire. The first guard bond wire has a first and second end coupled to ground. The second guard bond wire has a first and second end coupled to ground. The integrated circuit package further comprises a die. The die is mounted between the first and second guard bond wires such that the first and second guard bond wires distort a magnetic field between at least an input terminal and an output terminal of the die.

9 Claims, 8 Drawing Sheets

(51) Int. Cl.
*H01L 23/00* (2006.01)
*H03H 7/38* (2006.01)
(52) U.S. Cl.
CPC ........ *H03H 7/38* (2013.01); *H01L 2223/6611* (2013.01); *H01L 2223/6666* (2013.01); *H01L 2224/48101* (2013.01); *H01L 2224/48106* (2013.01); *H01L 2224/48157* (2013.01); *H01L 2224/48195* (2013.01); *H01L 2224/49109* (2013.01); *H01L 2224/49112* (2013.01); *H01L 2224/49175* (2013.01); *H01L 2924/19107* (2013.01)

(56) References Cited

U.S. PATENT DOCUMENTS

| | | |
|---|---|---|
| 2012/0313228 A1 | 12/2012 | Haba et al. |
| 2014/0167858 A1 | 6/2014 | van Zuijlen et al. |
| 2015/0002229 A1* | 1/2015 | Kuo ........................ H01L 24/85 |
| | | 330/295 |

OTHER PUBLICATIONS

Written Opinion of the International Searching Authority for PCT/EP2016/060667 dated Jul. 22, 2016, pp. 1-9.

* cited by examiner

GUARD BOND WIRES IN AN INTEGRATED CIRCUIT PACKAGE

CROSS-REFERENCE TO RELATED APPLICATION

The present application is a national stage entry of PCT/EP2016/060667 filed May 12, 2016, which claims priority to European Patent Application No. 15167488.4 filed May 13, 2015, the contents of which are hereby incorporated by reference.

FIELD OF THE DISCLOSURE

The present disclosure relates to impedance matching and, in particular, the configuration of an impedance matching circuit.

BACKGROUND

A functional circuit, fabricated on an integrated circuit die, may benefit from impedance matching. Impedance matching may adjust an input and/or output impedance of the functional circuit in order to adjust characteristics of the circuit, for example power transfer or signal reflection. For example, in radio frequency (RF) systems, matching the input impedance of the inputs with the load impedance reduces the signal reflection. Functional circuits may therefore be designed with impedance matching circuits. These impedance matching circuits may be included in-package. In other words, an impedance matching circuit may be coupled to the die before packaging of the die. The leads of the resulting integrated circuit package may be internally coupled to the terminals of the die via the impedance matching circuitry included in the package.

Inductance in an impedance matching circuit may be implemented through the use of bond wires coupling two nodes or terminals. Bond wires carrying current may realise a magnetic field which may cause undesired effects such as interference or feedback.

There exists scope for implementation of an in-package impedance matching circuit that may at least partially mitigate some undesired effects.

SUMMARY

According to a first aspect, there is provided an integrated circuit package comprising: a first guard bond wire having a first and second end coupled to ground; a second guard bond wire having a first and second end coupled to ground; and a die mounted between the first and second guard bond wires such that the first and second guard bond wires distort a magnetic field between at least an input terminal and an output terminal of the die.

The integrated circuit package may further comprise: an input impedance matching circuit coupled to the input terminal; and an output impedance matching circuit coupled to the output terminal; wherein the first and second guard bond wires are configured to distort the magnetic field caused by a mutual coupling between the input impedance matching circuit and the output impedance matching circuit.

The die may have a surface area with a first side and a second side that is opposite to the first side and at least a portion of the first guard bond wire is aligned with the first side of the die and at least a portion of the second guard bond wire is aligned with the second side of the die. The integrated circuit package may further comprise input and output impedance matching circuitry coupled to the die. The first and second guard bond wires may be orientated along a first axis that is parallel to an axis of orientation of at least one bond wire connection of the input and output impedance matching circuitry.

The at least a portion of the first guard bond wire may be aligned with the first side such that the at least a portion of the first bond wire runs parallel to the first side of the die. The at least a portion of the second guard bond wire may be aligned with the second side such that the at least a portion of the second guard bond wire runs parallel to the second side of the die. The surface area of the die may further have a third and a fourth side wherein the third and the fourth side are orthogonal to the first and the second side.

The input impedance matching circuitry may be arranged between an input package lead and the third side and the output impedance matching circuitry may be arranged between an output package lead and the fourth side. The at least one bond wire connection may be a first bond wire connection of the input impedance matching circuitry, wherein the first bond wire connection comprises a plurality of bond wires coupled to an input terminal of the die. The at least one bond wire connection may be a first bond wire connection of the output impedance matching circuitry, wherein the first bond wire connection comprises a plurality of bond wires coupled to an output terminal of the die.

The first and second end of the first guard bond wire may be coupled to ground through a respective first and second capacitor and the first and second end of the second guard bond wire may be coupled to ground through respective third and fourth capacitors. The value of the first, second, third and fourth capacitors may correspond to a frequency band of operation of the input and output impedance matching circuitry. The integrated circuit package may further comprise a flange wherein the die and the first, second, third and fourth capacitors are mounted to the flange. The first and third capacitors may be provided as part of an input capacitor of the input impedance matching circuitry and the second and fourth capacitors may be provided as part of an output capacitor of the output impedance matching circuitry.

The first and second guard wires may be configured to distort a magnetic field generated by at least one bond wire connection of the input impedance matching circuit and at least one bond wire connection of the output impedance matching circuitry. The first and second guard wires may be configured to distort the magnetic field to reduce a magnetic coupling between the input and output impedance matching circuitry.

According to a second aspect, there is provided an integrated circuit package comprising: a first guard bond wire having a first and second end coupled to ground; a second guard bond wire having a first and second end coupled to ground; and a die having a surface area with a first side and a second side that is opposite to the first side, the die being mounted between the first and second guard bond wires; wherein at least a portion of the first guard bond wire is aligned with the first side of the die and at least a portion of the second guard bond wire.

According to a third aspect, there is provided a radio frequency power amplifier package comprising: a die comprising a power amplifier and having a first input terminal and a second input terminal; an input impedance matching circuit coupled between the input terminal and an input package lead; an output impedance matching circuit coupled between the output terminal and an output package lead; a first guard bond wire having a first and second end coupled to ground; and a second guard bond wire having a first and second end coupled to ground; wherein the die is mounted between the first and second guard bond wires such that the first and second guard bond wires distort a magnetic field between at least the input terminal and the output terminal of the die.

BRIEF DESCRIPTION OF THE FIGURES

Embodiments will be described, by way of example only, with reference to the drawings, in which.

It will be appreciated that for features that span more than one drawing like reference numerals indicate the like feature.

DESCRIPTION

Figure 1:
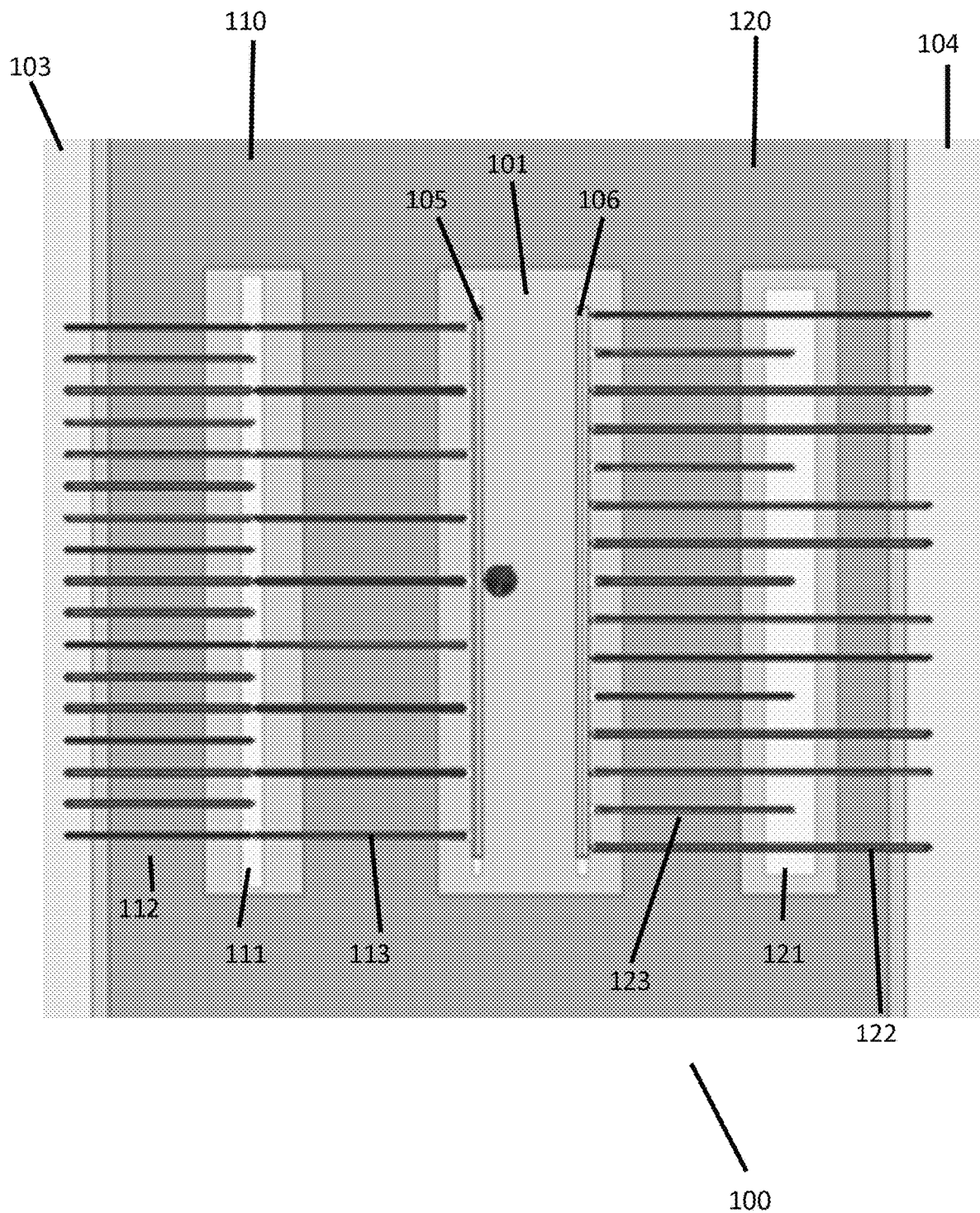
FIG. 1 shows an example of an integrated circuit package, according to an example embodiment.

FIG. 1 show a top view of an example of an integrated circuit package 100 comprising an active die 101 and impedance matching circuitry 110 and 120. The package 100 includes an input package lead 103 and an output package lead 104. The active die 101 includes an input terminal 105 and an output terminal 106. The input impedance matching circuitry 110 is configured to couple the input package lead 103 and the input terminal 105 of the die 101. The output impedance matching circuitry 120 is configured to couple the output terminal 106 of the die 101 to the output package lead 104.

Typically impedance matching circuitry is made up of components providing inductance and/or capacitance in order to match an input or output impedance of the functional circuitry on the active die 101. In this example, the impedance matching circuitry 110 and 120 comprise capacitors 111 and 121 and inductors 112, 113, 122 and 123.

In particular, the input impedance matching circuitry 110 may comprise a first inductor 112 coupled between the input package lead 103 and an input capacitor 111. The impedance matching circuitry 110 further may comprise a second inductor 113 coupled between the first capacitor 111 and the input terminal 105 of the die. The output impedance matching circuitry 120 may comprise a first inductor 122 coupled between the output terminal 106 of the die and the output package lead 104. The output impedance matching circuitry 120 further may comprise a second inductor 123 coupled between the output terminal 106 of the die and an output capacitor 121. The input and output capacitors 111 and 121 may further be coupled to a reference voltage such as ground.

As can be seen from FIG. 1, the inductors 112, 113, 122, 123 may be implemented as bond wire connections comprising a plurality of bond wires. A plurality of bond wires may be implemented to form a bond wire connection providing an inductance in order to allow an amount of current to flow while mitigating of electro-migration issues. The inductance provided by a bond wire connection 112, 113, 122, 123 may be determined at least in part by the number of bond wires in the connection, the length of the bond wires and/or the shape of a loop formed by the bond wires.

Figure 2:
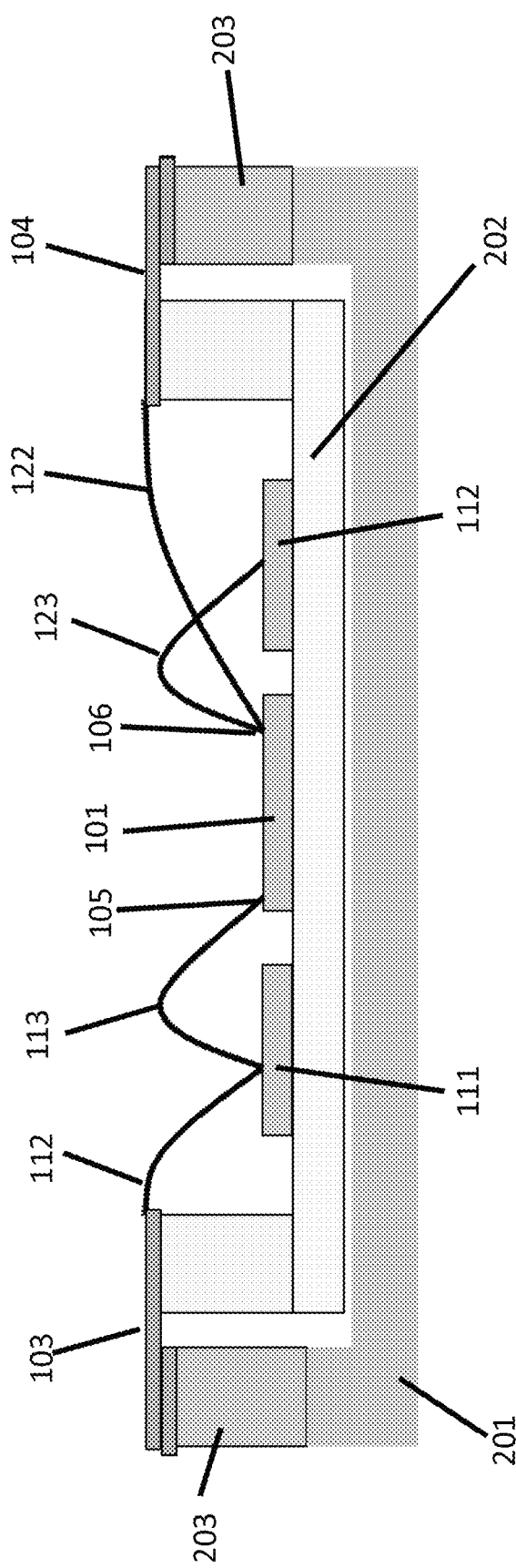
FIG. 2 shows a profile view of the integrated circuit package, according to an example embodiment.

FIG. 2 shows a side view of the package 100 and shows the respective loops provided by the bond wire connections 112, 113, 122, 123. It will be appreciated that like features in FIG. 2 are indicated by like reference numerals. In addition to the active die 101, the package of FIG. 2 shows a heat sink 201, flange 202 and printed circuit board (PCB) 203. FIG. 2 shows the length and the shape of the bond wires making up the inductors 112, 113, 122, 123. It will be appreciated that in this example, the bond wires of each bond wire connection are shaped symmetrically and thus each bond wire connection provides a single profile.

In particular, a loop formed by the bond wires providing the second inductor 113 of the input impedance matching circuitry 110 and the loop formed by the bond wired providing the second inductor 123 of the output impedance matching circuitry 120 is shown. The inductance provided by these bond wire connections may be determined by one or more characteristics of the bond wire connection, for example one or more of the height, shape and/or span of the loop provided by the bond wires in the connection. In some examples one or more of these characteristics may determine the length of the bond wires in the connection which may determine the inductance provided.

It will be appreciated that due to the current flow through each bond wire connection 112, 113, 122, 123, each bond wire connection will generate a magnetic field. In the example of FIG. 2, the large numbers of bond wires making up a bond wire connection and the height of the loop may cause a magnetic coupling between bond wire connections. In particular, a magnetic field generated by the bond wires at the output side may flow through the bond wires loops at the input side.

This magnetic coupling may cause increased series feedback coupling the input and output terminals 111 and 121. In some cases this feedback may be frequency dependent. Increased feedback may have undesired effects, for example reduced stability of the functional circuitry, increased dependence of the input impedance on the output load and/or reduced power efficiency and output power.

Figure 3:
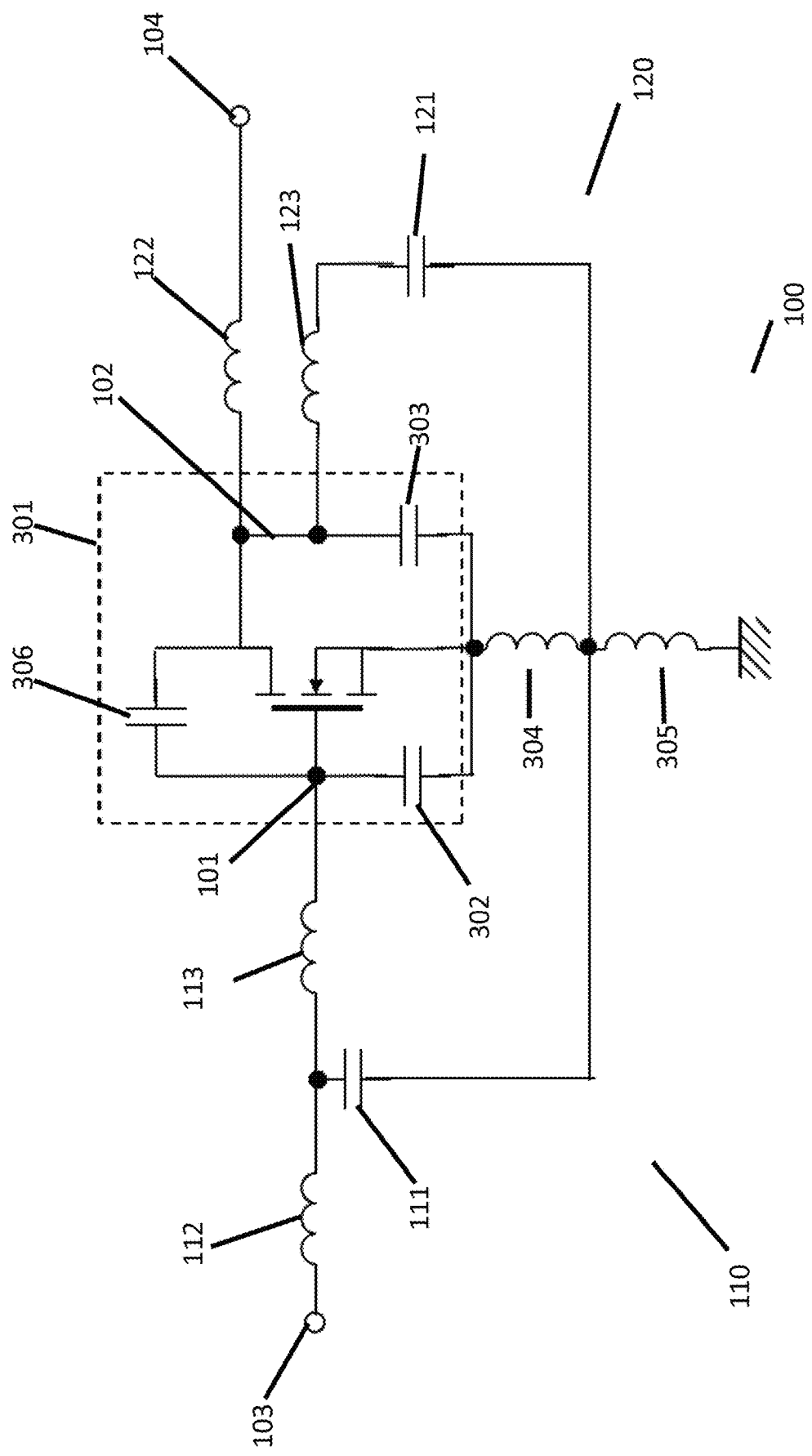
FIG. 3 is a circuit diagram of the integrated circuit package, according to an example embodiment.

FIG. 3 is a schematic diagram showing the circuitry of the package 100 including feedback. FIG. 3 shows on die functional circuitry 301 having the input terminal 101 and the output terminal 102. The input terminal 101 is coupled to an input package lead 103 via input impedance matching circuitry 110. The output terminal 102 is coupled to the output package lead 104 via output impedance matching circuitry 120.

The input impedance matching circuitry 110 comprises a first inductor 112 coupled between the input package lead 103 and an input capacitor 111. A second inductor 113 is coupled between the capacitor 111 and the input terminal 101. The output impedance matching circuitry 120 comprises a first inductor 122 coupled between the output terminal 102 and the output package lead 104. A second inductor 121 is coupled between the output terminal 102 and an output capacitor 121.

In this example, the functional circuitry 301 comprises a transistor where the input terminal 101 is the gate terminal of the transistor and the output terminal 102 is the drain terminal of the transistor. The input impedance of the transistor is modelled as a capacitor 302 coupled between the transistor drain and source. The output impedance of the transistor is modelled as a capacitor 303 coupled between the transistor drain and source.

As discussed with reference to FIG. 2, a magnetic coupling may occur between the bond wire loops of the inductors 112, 113, 122, 123. This magnetic coupling is modelled by the inductors 304 and 305 which are coupled between the source terminal and ground. The first inductor 304 is coupled between the source terminal of the transistor and the second inductor 305 which is further coupled to ground. A second terminal of input capacitor 111 and a second terminal of the output capacitor 121 is coupled to a coupling point between the first and second inductors 304 and 305.

In particular, the magnetic coupling between the second inductor 113 of the input impedance matching circuitry 110 and the second inductor 123 of the output impedance matching circuitry 120 is provided as the inductor 304. The magnetic coupling between the first inductor 112 of the input impedance matching circuitry 110 and the first inductor 122 of the output impedance matching circuitry 120 is provided as the inductor 305. A third capacitor 306 of the functional circuit may be coupled between the gate and drain terminal of the transistor and may represent the parasitic capacitive parallel feedback of the active die 101.

The inductance 304, 305 due the magnetic coupling may create undesired effects, for example reduced stability of the functional circuitry, increased dependence of the input impedance on the output load and/or reduced power efficiency and output power.

While one example of a configuration of input and output impedance matching circuitry has been given in FIGS. 1 to 3, it will be appreciated that the input and output impedance matching circuitry may be implemented in a variety of configurations. While the impedance matching circuitry of FIGS. 1 to 3 has been depicted as comprising a low pass network at the input and an inshin (shunt inductor) network at the output, embodiments may be applicable to other impedance matching circuitry. For example, in some embodiments, the impedance matching circuitry may take the form of a double low-pass network, inshin-lowpass network, back-bonded network or other impedance matching. In examples, embodiments may be applied to impedance matching circuitry where a mutual coupling between the input and output impedance matching circuitry is possible. Embodiments may be applicable to cases where there is an input bond wire connection and an output bond wire connection.

Embodiments of the present disclosure may incorporate a first and a second guard bond wire to distort a field realised by input and output impedance matching circuitry. In examples, the active die may be mounted in between the first and second guard bond wires. The guard wires may be parallel to input and output bond wires coupled to input and output terminals of the die and may be aligned with an area of the die between the input and output terminals. By aligning the first and second guard wire with a respective first and second side of the die corresponding to an area between the input and output terminals, the guard wires may be placed to distort any magnetic fields generated by the input and output bond wire connections to the die. In some cases, the magnetic field may be distorted in such a way as to reduce any mutual coupling between the input and output bond wires.

The guard bond wires may be connected to the ground and may be configured to provide a boundary for any magnetic fields. In some examples, this may reduce the feedback from output to the input. In some examples, the guard bond wires may be coupled to ground may via shunt capacitors. The shunt capacitance may be selected to compensate the inductance of the guard bond wires in a band of interest.

Figure 4:
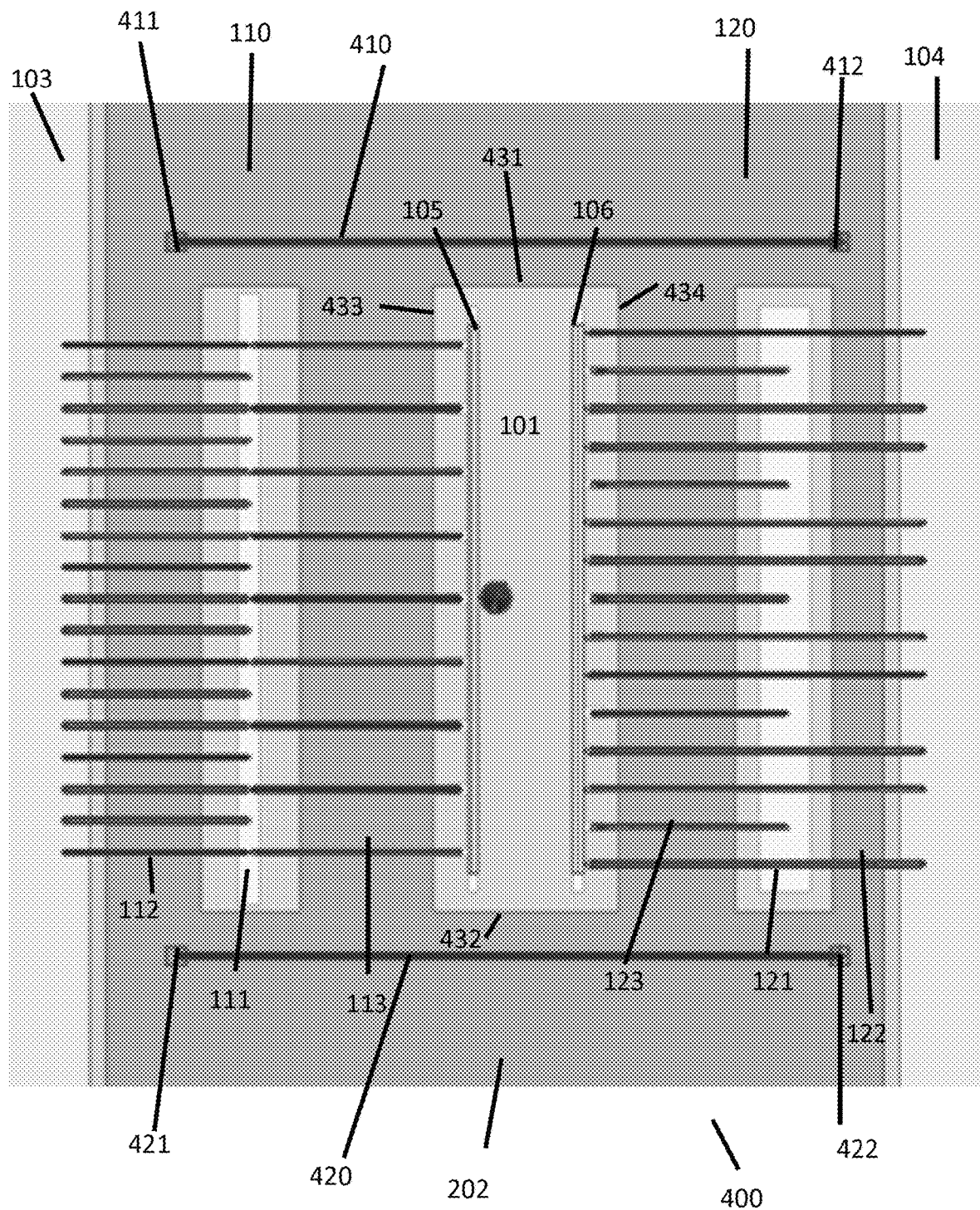
FIG. 4 shows an example of an integrated circuit package according to an example embodiment.

FIG. 4 shows an example of an integrated circuit package 400 according to some embodiments. It will be appreciated that the integrated circuit package of FIG. 4 may be similar to that of FIG. 1 and FIG. 2 and that like numerals will indicate like features.

The integrated circuit package 400 comprises an input package lead 103, an output package lead 104, active die 101, input impedance matching circuit 110 and output impedance matching circuit 120. It will be appreciated that the input impedance matching circuitry 110 may be identical to that of FIG. 1, namely comprising the first inductor 112, second inductor 113 and input capacitor 111 and is coupled to the input terminal 105 of the die 101. The output impedance matching circuitry 120 may be identical to that of FIG. 1, namely comprising the first inductor 122, second inductor 123 and capacitor 121 coupled to the output terminal 106 of the die 101.

The integrated package 400 may comprise a flange 202 on which the die 101 is mounted. The input impedance matching circuitry 110 may be arranged between the input package lead 103 and the input terminal 105 and over the flange 202. The output impedance matching circuitry 120 may be arranged between the output package lead 104 and the output terminal 106 and over the flange 202. The input and output capacitors 111 and 121 may be mounted on the flange 202.

In addition to the die 101 and output and input impedance matching circuitry 110 and 120 of FIG. 1, the package 400 of FIG. 4 further includes guard bond wires 410 and 420 mounted to the flange. The guard bond wires 410 and 420 may be mounted to the flange via terminating capacitors. The package 400 includes a first guard bond wire 410 having a first end coupled to a first capacitor 411 and a second end coupled to a second capacitor 412. A second guard bond wire 420 has a first end coupled to a third capacitor 421 and a second end coupled to a fourth capacitor 422.

The die 101 may be mounted to the flange 202 between the first guard bond wire 410 and the second guard bond wire 420. At least a portion of the first guard bond wire may be aligned with a first side 431 of the die 101 and at least a portion of the second guard wire 420 may be aligned with a second side 432 of the die 101. In the example of FIG. 4, a portion of the first guard bond wire 410 is aligned along the length of the first side 431 with further portions of the first guard bond wire 410 extending to the first and second capacitors 411 and 412 respectively. Similarly, at least a portion of the second guard bond wire 420 may be aligned along a length of the second side 432 with further portions of the second guard bond wire 420 extending to the second and third capacitors 421 and 422 respectively. The first 431 and second 432 sides may be opposite sides of the die 101.

In this example the first and second guard bond wires 410 and 420 are orientated along a parallel axis to the axis of orientation of the bond wire connections 112, 113, 121 and 122. In this example, at least a portion of guard first bond wire 410 is parallel to the first side 431 and at least a portion of the second guard bond wire 420 is parallel to the second side 432.

The input impedance matching circuitry 110 may be arrange over the flange 202 on a third side 433 of the die and the output impedance matching circuitry 120 may be arrange over the flange 202 on a third side of the die. In this example the die has a rectangular surface area with a top surface having a first 431, second 432, third 433 and fourth 434 side. The input and output terminals 105 and 106 are arranged on the top surface of the die 101 and a bottom surface of the die 101 is mounted to the flange 202. The first side 431 is opposite to the second side 432. The third side 433 is opposite to the fourth side 434. The first and second sides 431, 432 are orthogonal to the third and fourth sides 433, 434.

In the example of FIG. 4, the each end of the first guard bond wire 410 terminates in a capacitor 411, 412 and each end of the second guard bond wire 420 terminates in a capacitor 421, 422. Each of the capacitors 411, 412, 421 and 422 may be mounted to the flange and coupled to a reference voltage such as ground.

It will be appreciated that while in this example, the first and second guard bond wires 410 and 420 are of a first length that extends across a width including the input capacitor 111, die 101 and output capacitor 121, the length of the first and second guard bond wires 410 and 420. At least a portion of the first and second guard bond wires 410 and 420 may run parallel to an area of the die 101 that spans between the input terminal and the output terminal.

The guard bond wires 410 and 420 are positioned to distort any magnetic fields generated by the bond wire connections 112, 113, 122 and 123. In an example, these fields may be distorted to lessen a mutual coupling between the bond wire connections. In another example, the guard bond wires may be configured to distort a magnetic field caused by the mutual coupling in order to increase the magnetic field. In this manner, the guard bond wires may at least partially compensate a capacitive coupling internal to the die for example.

Figure 5:
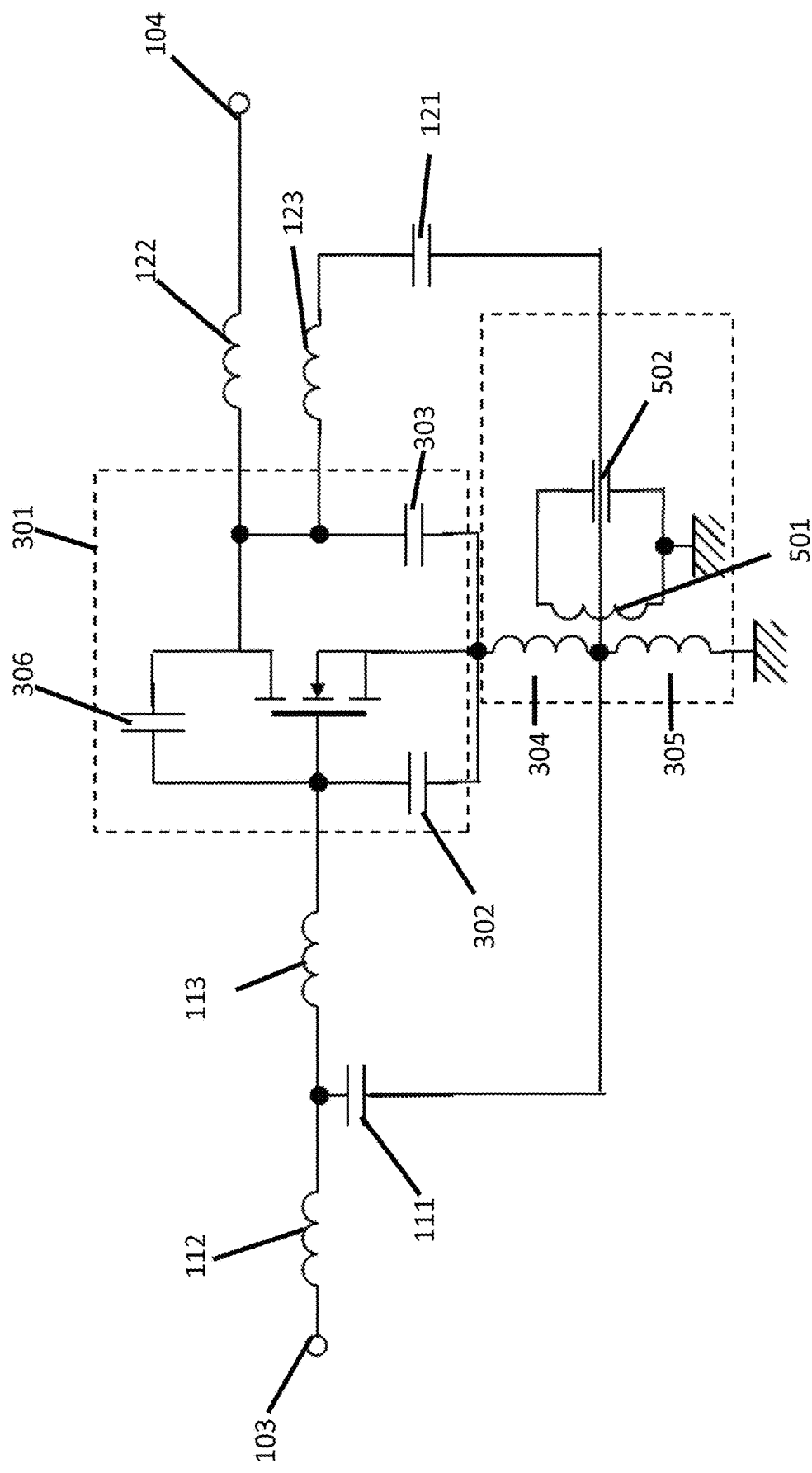
FIG. 5 is a circuit diagram of an integrated circuit package according to an example embodiment.

FIG. 5 is a circuit diagram representing the inductances and capacitances realised by the package 400 of FIG. 4.

FIG. 5 is similar to the circuit diagram of FIG. 3 with the addition of the inductance and capacitance realised by the addition of the guard bond wires 410 and 420. In this regard, like reference numerals to FIG. 3 indicates like features in FIG. 5.

In addition to the first and second inductors 304 and 305 representing the feedback due to mutual coupling, the circuit 500 of FIG. 5 further includes a correction inductor 501 and shunt capacitor 502. The inductor 501 may represent the inductance realised by the first and second guard bond wires 410 and 420. The capacitance 502 may represent the capacitance provided by the terminating capacitors 411, 412, 421 of the guard bond wires 410 and 420.

It will be appreciated that the functional circuitry may operate in a desired frequency band. In some embodiments, the value of the terminating capacitors 411, 412, 421 and 422 may be altered to tune the operation of the guard bond wires 410, 420 to this band of operation.

In the package 400 of FIG. 4, it will be appreciated that the guard bond wires 410 and 420 may be magnetically coupled to the first and second inductors 112 and 113 of the impedance matching circuitry 110 and to the first and second inductors 122, 123 of the output impedance matching circuitry 120. The inductance 501 realised by the first and second guard bond wires 410 and 420 may be represented as a correctional inductance 501 coupled to the first and second series feedback inductors 304 and 305. The correctional inductor 501 may form a feedback network with the first and second inductors 501 and 502 and the parasitic capacitive parallel feedback capacitor 306.

The correctional inductor 501 may further form a resonance contour with the shunt capacitance 502. This resonance contour may modify the frequency response of the feedback network comprising the first and second inductors 501 and 502, the correctional inductor 501 and the parasitic capacitive parallel feedback capacitor 306. The correctional inductor 501 may influence the spatial distribution of the resulting magnetic field realized by the inductors 112, 113, 122 and 123 of the package 400. The influence of the guard bond wires 410 and 420 on the spatial distribution of the resulting magnetic field may be determined by the length, shape and/or height of the guard bond wires 410 and 420, and/or the distance of the guard bond wires 410 and 420 from the respective first and second sides of the die.

Figure 6:
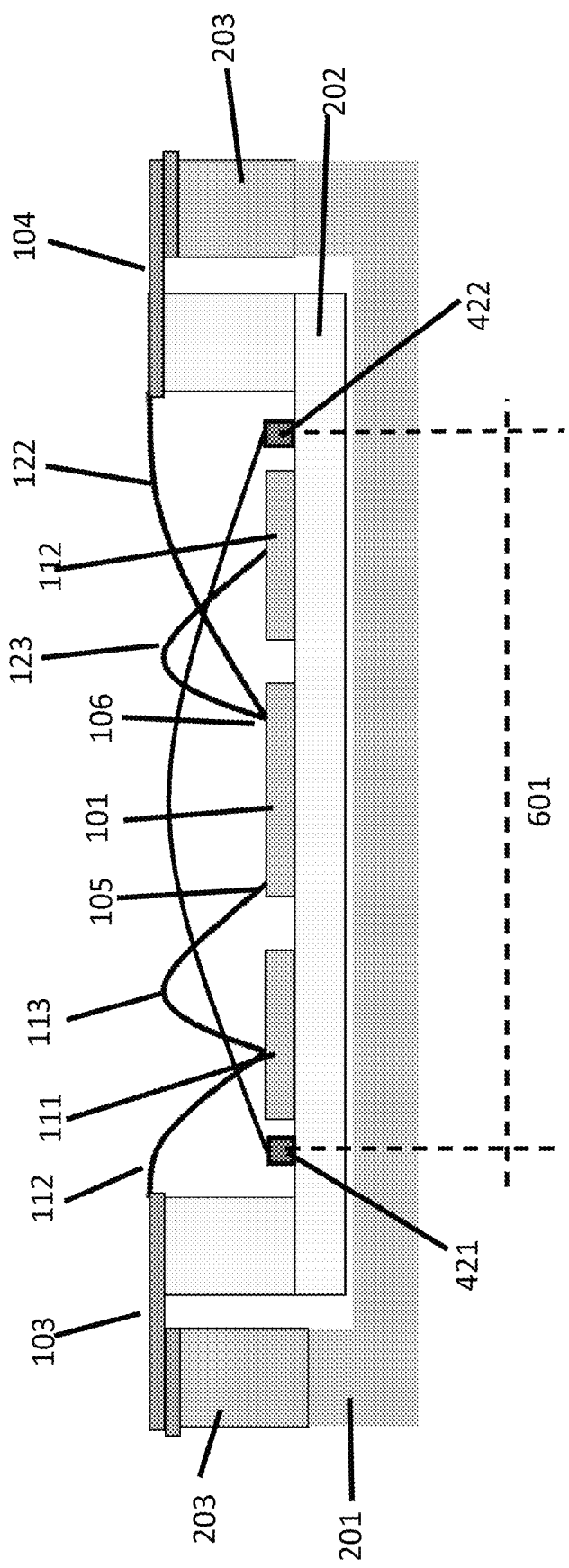
FIG. 6 is a profile view of an integrated circuit package, according to an example embodiment.

FIG. 6 shows a profile view of the example embodiment of FIG. 4. It will be appreciated the features of FIG. 6 may be similar to those of FIG. 2 with the addition of the second guard bond wire 420 and terminating capacitors 421 and 422 and like reference numerals may identify like features. It will be appreciated, that in this example the first guard bond wire 410 and the second guard bond wire 420 may be symmetrically shaped and thus only the second guard bond wire is shown in profile. In the example of FIG. 6, the guard bond wire 420 may form a loop from the third terminating capacitor 421 to the fourth terminating capacitor 422. In some example, the height of the loop may determine the length of the bond wire used to implement the guard bond wire and hence may at least partially determine the inductance provided by the guard bond wire. Additionally or alternatively, the shape of the loop may influence the inductance provided by the guard bond wire.

The position of the third and fourth terminating capacitors 421 and 422 may determine a width 601 of the flange 202 spanned by the guard wire. In this example, the capacitors 421 and 422 are positioned so that the width 601 of the flange 202 spanned by the guard wire 420 includes the input capacitor 111, the die 101 and the output capacitor 121. It will however be appreciated that the width 601 of flange 202 spanned by a guard wire 410, 420 may vary, however the guard wire 410, 420 will span at least the width of the die 101. In some examples, increasing the span of the guard wires may increase the effectiveness of the guard wires. For example, an increased span may enable the guard wires to provide a greater distortion of the magnetic field.

In the examples of FIGS. 4 to 6, the guard wires 410 and 420 are terminated in capacitors 411, 412, 421 and 422 mounted on the flange 202. In a further embodiment, the input and output capacitor structures 111 and 121 may be modified to provide the terminating capacitance in addition the input and output capacitance.

Figure 7:
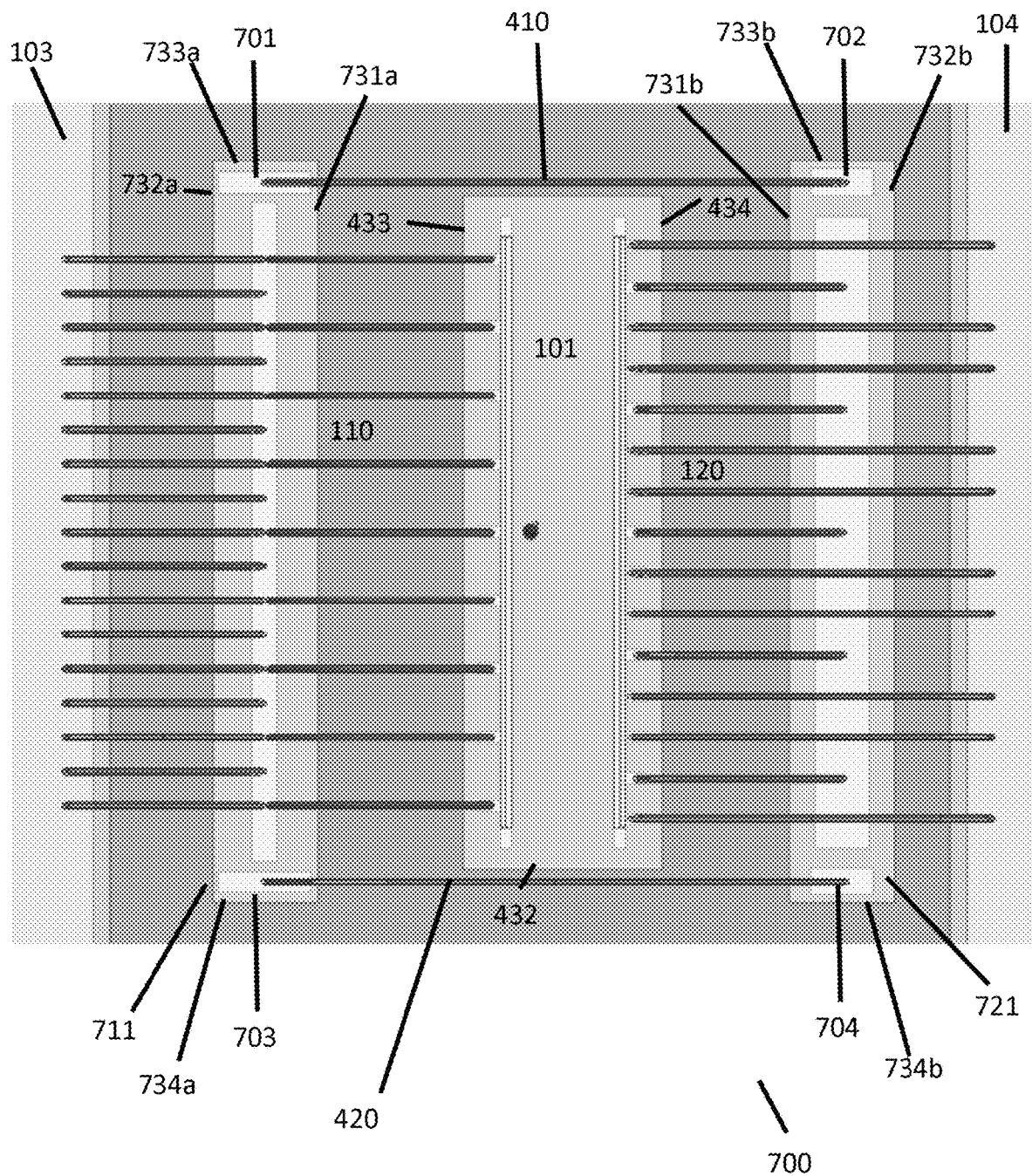
FIG. 7 shows an example of an integrated circuit package, according to an example embodiment.

FIG. 7 shows an example of this further embodiment. It will be appreciated that the features of FIG. 7 may be similar to those of 4 with the exception of the placement of the terminating capacitors. FIG. 7 comprises a package 700 having an input package lead 103, and output package lead 104, a die 101, input impedance matching circuitry 110 arranged between an input terminal 105 of the die 101 and the input package lead 103 and output impedance matching circuitry 120 arranged between an output terminal 106 of the die and the output package lead 104. The package 700 further comprises a first and second guard bond wire 410 and 420.

The input impedance matching circuitry 110 may further include a modified input capacitor structure 711. The input capacitor structure 711 may be similar to that of FIG. 4 with a modification to provide a first and third terminating capacitor 701 and 703 for respective first ends of the first and second guard bond wires 410 and 420. The output impedance matching circuitry 120 may further include a modified output capacitor structure 721. The output capacitor structure 721 may be similar to that of FIG. 4 with a modification to provide a second and fourth terminating capacitor 702 and 704 for respective second ends of the first and second guard bond wires 410 and 420.

The input and output capacitors may be modified by extending the capacitors structures 111 and 121 to provide additional portions extending beyond the first and second sides 431 and 432 of the die 101. The terminating capacitors may be provided on these extended portions. The terminating capacitors may be provided as a conductive area, for example a metal area. The size of the area may correspond to the capacitance of a terminating capacitor. The input and output capacitor structures may therefore be modified to extend the structure of the capacitors to include extended portions. The terminating capacitors may be provided on the extended portions of the capacitor structures. The extended capacitor structures will therefore provide an input or output capacitor and two terminating capacitors for the guard wires.

In the example of FIG. 7, the capacitors structures 711 and 721 may each have a rectangular surface area with a first, second, third and fourth side. The input capacitor structure 711 may comprise a rectangular surface area having a first side 731a, a second side 732a, a third side 733a and a fourth side 734a. Similarly, the output capacitor structure 721 may comprise a rectangular surface area having a first side 731b, a second side 732b, a third side 733b and a fourth side 734b.

The first and the second sides of each capacitor structure 711 and 721 may be opposite and the third and fourth sides of each capacitor structure 711 and 721 may be opposite. The first and the second side of a capacitor structure may be orthogonal to the third and the fourth side of that capacitor structure.

Referring to the input capacitor structure 711, the first side 731a may face the third side 433 of the die 101. A portion of the first side 731a may be aligned with the third side 433 of the die 101. A first additional portion of the first side 731a may extend beyond a first end of the third side 433. A second additional portion of the first side 731a may extend beyond a second end of the third side 433. The first and third terminating capacitors 701 and 703 may be provided on the first and second additional portions of the input capacitor structure 711 respectively.

Referring now to the output capacitor structure 721, the first side 731b may face the fourth side 433 of the die 101. A portion of the first side 731b may be aligned with the fourth side 433 of the die 101. A first additional portion of the first side 731b may extend beyond a first end of the fourth side 433. A second additional portion of the first side 731b may extend beyond a second end of the fourth side 433. The second and fourth terminating capacitors 702 and 704 may be provided on the first and second additional portions of the input capacitor structure 721 respectively.

It will be appreciated that the first end of the third and fourth sides 433 and 434 may correspond to the first side 431 of the die and the second end of the third and fourth sides 433 and 434 may correspond to the second side 432 of the die 101.

The guard bond wires 410 and 420 may be terminated on either end by a capacitor. In one example, the guard bond wires have been described as being terminated in capacitors mounted on the flange. In a second example, the guard bond wires have been described as being terminated in capacitors that are provided on the same capacitor support structure as the input and output capacitors. In these examples, the guard bond wires may further be terminated in a resistance, for example each end of each bond wire may be coupled in series to a resistor and a terminating capacitor. In these examples the series coupled resistor and capacitor may shunt the guard wire to ground. It will be appreciated that the impedance matching circuitry and/or the guard bond wires may be designed to operate in a frequency band of interest. The value of the resistor may for example be selected to damp out-of-band instability peaks.

Figure 8:
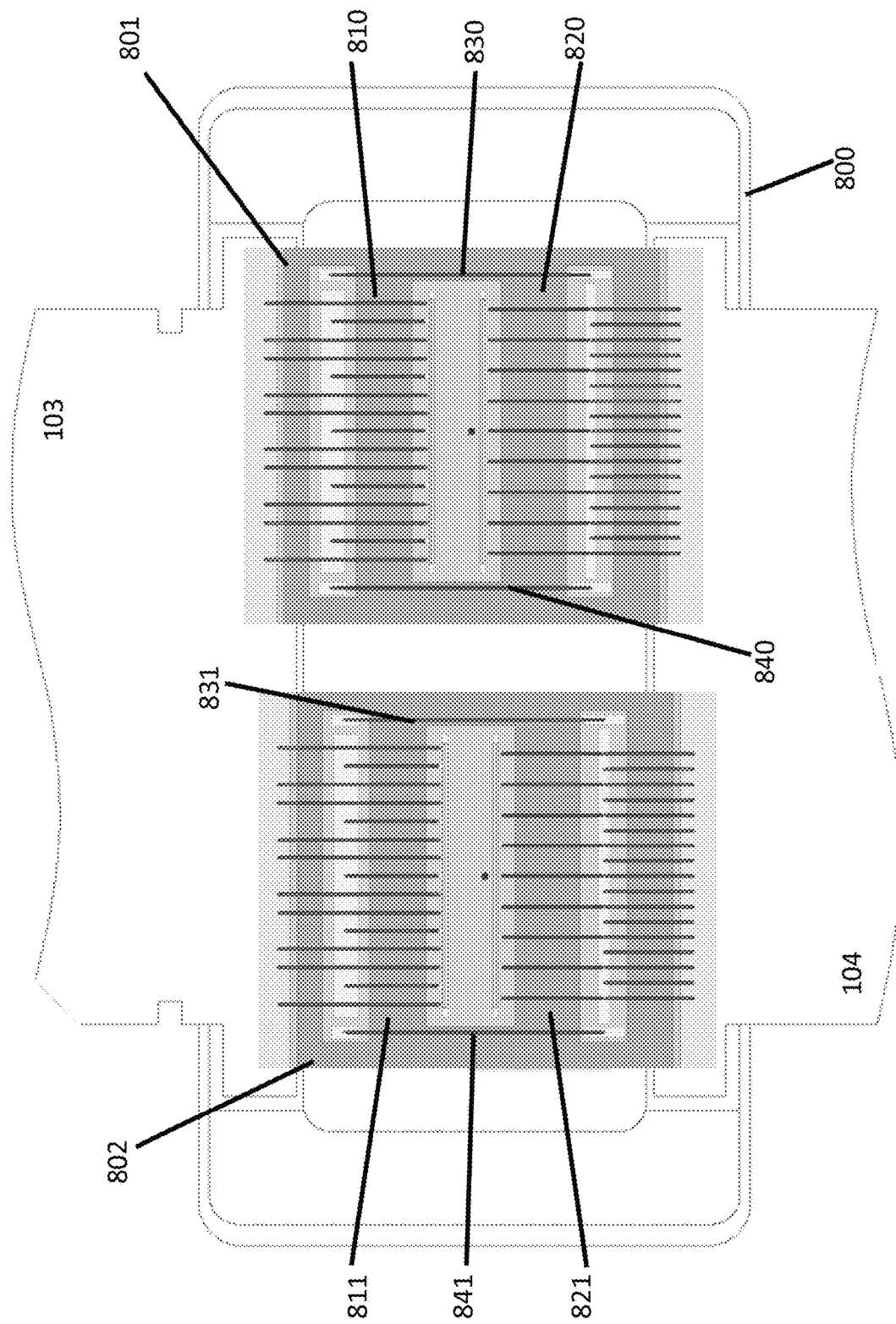
FIG. 8 shows an example of a multi-die integrated circuit package according to an example embodiment.

In the foregoing, a package 400, 700 has been exemplified as comprising one die 101. It will however be appreciated that in some embodiments, more than one die 101 may be implemented in a package. FIG. 8 shows an example of a package 800 in which more than one die in accordance with an embodiment is implemented.

FIG. 8 shows a package 800 comprising an input package lead 103 and an output package lead 104. The package comprises a first die 801 having an input and output impedance matching circuitry 810 and 820 and guard bond wires 830 and 840. The package further comprises a second die 802 having input and output impedance matching circuitry 811 and 821 and guard bond wires 831 and 841. It will be appreciated that two die 801 and 802 are by way of example only and more than two may be implemented in package 800. In this example a pair of guard bond wires may be implemented for each die 801, 802 included in the package 800.

In the foregoing, the functional circuitry on the die has been exemplified as being a transistor. It will be appreciated that the functional circuitry may be other functional circuitry. In one example, the package may comprise radio frequency (RF) packaged transistors for power applications. Additionally or alternatively the input and output capacitors may be metal oxide semiconductor (MOS) capacitors. In some examples, the transistor may be a metal oxide semiconductor field effect transistor (MOSFET).

In the foregoing a configuration of the guard bond wires has been described. It will be appreciated that the ability of the guard wires to distort a magnetic field may be determined by one or more characteristics of the guard bond wires. For example one or more of a length of the guard bond wire, the width of the integrated circuit package or flange spanned by the guard bond wire, shape and/or height of a loop provided by the guard bond wire and/or distance of the guard bond wire from a side of the die may be configured or set to adjust the distortion of the magnetic field provided by the guard bond wire. Additionally or alternatively a configuration of the guard bond wires with respect to each other may adjust the distortion provided by the guard bond wires. For example, a distance between the guard wires, different in length and/or loop shape and/or degree of symmetry of the guard bond wires may adjust the distortion to the magnetic field.

It will be readily understood that the components of the embodiments as generally described herein and illustrated in the appended figures could be arranged and designed in a wide variety of different configurations. Thus the foregoing is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of this disclosure is, therefore, indicated by the appended claims rather than by this detailed description. All changes that come within the meaning and range of equivalency of the claims are to be embraced within their scope.

Reference throughout this specification to features, advantages, or similar language does not imply that all of the features and advantages that may be realized with the present disclosure should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

The invention claimed is:

1. An integrated circuit package, comprising:
   a first guard bond wire having a first and second end coupled to ground;
   a second guard bond wire having a first and second end coupled to ground; and
   a die mounted between the first and second guard bond wires such that the first and second guard bond wires distort a magnetic field between at least an input terminal and an output terminal of the die, wherein the die has a surface area with a first side and a second side that is opposite to the first side and at least a portion of the first guard bond wire is aligned with the first side of the die and at least a portion of the second guard bond wire is aligned with the second side of the die; and
   a flange on which the die is mounted;
   wherein the at least a portion of the first guard bond wire is aligned with the first side such that the at least a portion of the first bond wire runs parallel to the first side of the die, and wherein the at least a portion of the second guard bond wire is aligned with the second side such that the at least a portion of the second guard bond wire runs parallel to the second side of the die,
   wherein the first and/or second end of the first guard bond wire is/are coupled to ground through a flange mounted first and/or second capacitor, respectively, and the first and/or second end of the second guard bond wire is/are coupled to ground through a flange mounted third and/or fourth capacitor, respectively.

2. The integrated circuit package of claim 1, wherein the die is an active die on which a power amplifier is arranged.

3. The integrated circuit package of claim 1, further comprising input and output impedance matching circuitry coupled to the input terminal and output terminal of the die, respectively.

4. The integrated circuit package of claim 3, wherein the input impedance matching circuitry comprises an input capacitor structure that is provided with an input capacitor and the first and/or third capacitor and/or wherein the output impedance matching circuitry comprises an output capacitor structure that is provided with an output capacitor and the second and/or fourth capacitor.

5. The integrated circuit package of claim 3, wherein the first and second guard bond wires are orientated along a first axis that is parallel to an axis of orientation of at least one bond wire connection of the input and output impedance matching circuitry.

6. The integrated circuit package of claim 5, wherein the at least one bond wire connection of the input impedance matching circuitry is a first bond wire connection of the input impedance matching circuitry, wherein the at least one bond wire connection of the input impedance matching circuitry comprises a plurality of bond wires coupled to an input terminal of the die.

7. The integrated circuit package of claim 5, wherein the at least one bond wire connection of the output impedance matching circuitry is a first bond wire connection of the output impedance matching circuitry, wherein the at least one bond wire connection of the output impedance matching circuitry comprises a plurality of bond wires coupled to an output terminal of the die.

8. The integrated circuit package of claim 3, wherein the surface area of the die further has a third and a fourth side wherein the third and the fourth side are orthogonal to the first and the second side.

9. The integrated circuit package of claim 8, wherein the input impedance matching circuitry is arranged between an input package lead and the third side and the output impedance matching circuitry is arranged between an output package lead and the fourth side.

* * * * *